United States Patent
Seok et al.

(10) Patent No.: US 11,342,907 B2
(45) Date of Patent: May 24, 2022

(54) ELECTRONIC DEVICE INCLUDING EQUALIZING CIRCUIT AND OPERATING METHOD OF THE ELECTRONIC DEVICE

(71) Applicant: Samsung Electronics Co., Ltd., Suwon-si (KR)

(72) Inventors: Hyungi Seok, Daegu (KR); Seungjin Kim, Hwaseong-si (KR); Byungki Han, Seoul (KR); Jaehoon Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 100 days.

(21) Appl. No.: 16/866,871

(22) Filed: May 5, 2020

(65) Prior Publication Data
US 2021/0099164 A1    Apr. 1, 2021

(30) Foreign Application Priority Data
Sep. 30, 2019 (KR) .......................... 10-2019-0120904

(51) Int. Cl.
*H03K 5/1534* (2006.01)
*H03K 3/017* (2006.01)
*H03K 5/151* (2006.01)
*H03K 5/24* (2006.01)

(52) U.S. Cl.
CPC .......... *H03K 5/1534* (2013.01); *H03K 3/017* (2013.01); *H03K 5/151* (2013.01); *H03K 5/249* (2013.01)

(58) Field of Classification Search
CPC ...... H03K 5/1534; H03K 3/017; H03K 5/151; H03K 5/249
See application file for complete search history.

(56) References Cited

U.S. PATENT DOCUMENTS

| | | | | |
|---|---|---|---|---|
| 4,650,930 A | * | 3/1987 | Hogeboom | H04L 25/03057 379/93.05 |
| 5,949,597 A | * | 9/1999 | Pahr | H03K 5/24 360/46 |
| 6,307,409 B1 | | 10/2001 | Wrathall | |
| 7,447,085 B2 | | 11/2008 | Boemler | |
| 8,143,917 B2 | | 3/2012 | Jang et al. | |
| 8,391,350 B2 | | 3/2013 | Chan et al. | |
| 8,633,764 B2 | | 1/2014 | Agrawal et al. | |

(Continued)

FOREIGN PATENT DOCUMENTS

KR    10-1633471 B1    6/2016

OTHER PUBLICATIONS

Extended European Search Report dated Oct. 13, 2020 for EP Patent Application No. 20176782.9.

*Primary Examiner* — Dinh T Le
(74) *Attorney, Agent, or Firm* — Harness, Dickey & Pierce, P.L.C.

(57) ABSTRACT

An electronic device includes: a first equalizing circuit configured to receive a data signal and output a first equalizing signal based on the data signal; a pulse generator configured to generate a first pulse signal and a second pulse signal in response to a rising edge and a falling edge of the data signal, respectively; a second equalizing circuit configured to output a second equalizing signal based on the first pulse signal and the second pulse signal that have been inverted; and an output terminal configured to output an output signal in which the first equalizing signal and the second equalizing signal have been summed.

20 Claims, 14 Drawing Sheets

(56) References Cited

U.S. PATENT DOCUMENTS

| | | |
|---|---|---|
| 9,338,036 B2 | 5/2016 | Poulton et al. |
| 9,496,963 B2 | 11/2016 | Parikh |
| 9,503,293 B2 | 11/2016 | Kim |
| 9,800,436 B2 | 10/2017 | Sakai |
| 2002/0125933 A1 | 9/2002 | Tamura et al. |
| 2014/0103962 A1 | 4/2014 | Ajram |
| 2018/0292682 A1 | 10/2018 | Dupuis et al. |
| 2019/0140131 A1 | 5/2019 | Waki |

* cited by examiner

ELECTRONIC DEVICE INCLUDING EQUALIZING CIRCUIT AND OPERATING METHOD OF THE ELECTRONIC DEVICE

CROSS-REFERENCE TO RELATED APPLICATION

This application claims the benefit of Korean Patent Application No. 10-2019-0120904, filed on Sep. 30, 2019, in the Korean Intellectual Property Office, the disclosure of which is incorporated herein in its entirety by reference.

BACKGROUND

Example embodiments of the inventive concepts relate to an electronic device including an equalizing circuit for correcting a data signal and/or an operating method of the electronic device.

As data transmission speeds increase with the development of the electronics industry, the importance of data communication technology between internal components of electronic devices such as chip-to-chip data communication is increasing. Chip-to-chip data communication technology may be, for example, communication between a memory interface and a memory device and/or communication between a radio frequency integrated chip (RFIC) and a processor. However, the components inside the electronic device are required to satisfy high levels of electrostatic discharge (ESD) conditions, and the data transmission speed may be limited due to constraints of inductors due to high integration of the electronic device, and provision of source voltage (Vss) termination, etc. Accordingly, a chip size and cost increase due to the limited transmission speed of the electronic device.

SUMMARY

Example embodiments of the inventive concepts provide an electronic device for improving data transmission speed while overcoming trade-off conditions.

According to an example embodiment of the inventive concepts, there is provided an electronic device including: a first equalizing circuit configured to receive a data signal, and to generate a first equalizing signal based on the data signal; a pulse generator configured to generate a first pulse signal and a second pulse signal in response to a rising edge and a falling edge of the data signal, respectively; a second equalizing circuit configured to output a second equalizing signal based on an inverted first pulse signal and an inverted second pulse signal, the inverted first pulse signal and the inverted second pulse signal being inversions of the first pulse signal and the second pulse signal, respectively; and an output terminal configured to output an output signal based on the first equalizing signal and the second equalizing signal.

According to another example embodiment of the inventive concepts, there is provided an electronic device including: a first equalizing circuit configured to receive a data signal, and to generate a first equalizing signal having a phase inverted from a phase of the data signal; a pulse generator configured to, generate a negative pulse signal based on a falling edge of the data signal, generate a positive pulse signal based on a rising edge of the data signal, and generate a pulse signal such that the pulse signal includes the negative pulse signal and the positive pulse signal therein; a second equalizing circuit configured to output a second equalizing signal based on an inverted pulse signal, the inverted pulse signal being an inversion of the pulse signal; and an output terminal configured to output an output signal based on the first equalizing signal and the second equalizing signal.

According to another example embodiment of the inventive concepts, there is provided a method of operating an electronic device, the method including: receiving a data signal; generating a first equalizing signal having a phase inverted from a phase of the data signal; generating a negative pulse signal, based on a falling edge of the data signal; generating a positive pulse signal based on a rising edge of the data signal; generating a pulse signal such that the pulse signal includes the negative pulse signal and the positive pulse signal; outputting a second equalizing signal based on an inverted pulse signal, the inverted pulse signal being an inversion of the pulse signal; and outputting an output signal obtained based on the first equalizing signal and the second equalizing signal.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Hereinafter, example embodiments of the inventive concepts are described in detail with reference to the accompanying drawings.

Figure 1:
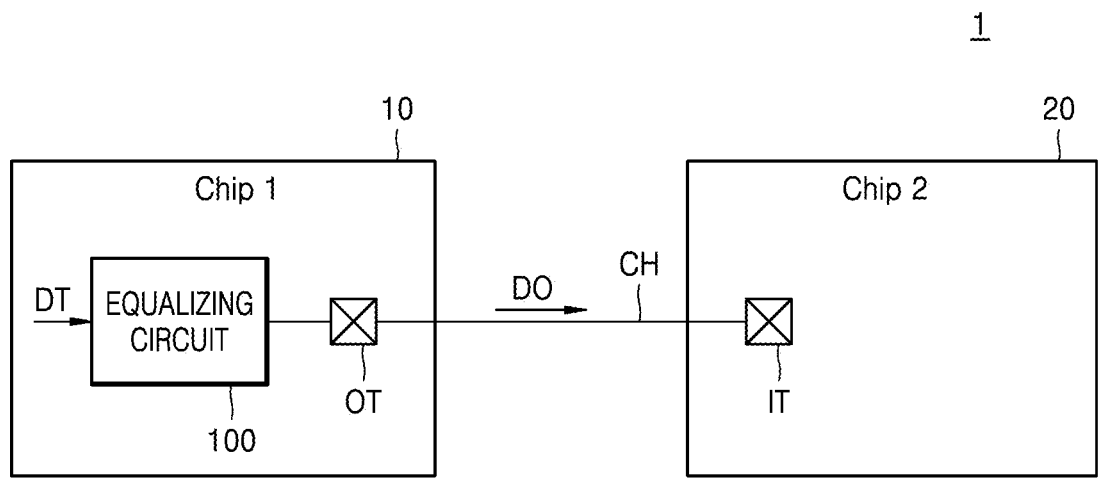
FIG. 1 is a block diagram illustrating an electronic device according to an example embodiment of the inventive concepts.

FIG. 1 is a block diagram illustrating an electronic device 1 according to an example embodiment of the inventive concepts.

Referring to FIG. 1, the electronic device 1 may include a first chip 10 and a second chip 20, and the first chip 10 may include an equalizing circuit 100 and an output terminal OT, and the second chip 20 may include an input terminal IT. For example, the electronic device 1 may be included in at least one of a smart phone, a mobile device, an image display device, an image capturing device, an image processing device, a measuring device, a smart TV, a drone, a robot such as an advanced driver assistance system (ADAS), a medical device, and an Internet of Things (IoT) device. As another example, the electronic device 1 may include a modem or an application processor (AP). The AP may include components (for example, chips, logics, cores, etc.) that perform a plurality of functions, and may include portions or the entirety of the first chip 10 and the second chip 20 as a logic circuit.

According to an example embodiment of the inventive concepts, the first chip 10 may include a radio frequency integrated chip (RFIC), and the second chip 20 may include a processing chip. For example, the first chip 10 may receive a wireless communication signal of various frequencies and convert the received wireless communication signal into a data signal DT of a digital type. The equalizing circuit 100 may output an output signal DO corrected from the data signal DT to the second chip 20 via the output terminal OT. The output signal DO may be transmitted to the second chip 20 through a channel CH connected between the first chip 10 and the second chip 20. Although the channel CH is illustrated as one conductive wire for convenience of description, a plurality of channels CH may be connected between the first chip 10 and the second chip 20. The second chip 20 may receive the output signal DO via the input terminal IT and may perform various operation processes based on the output signal DO.

According to an example embodiment of the inventive concepts, the first chip 10 may communicate by using at least one communication method (or communication protocol) among 5th (5G) generation, long term evolution (LTE), 3rd (3G) generation, world interoperability for microwave access (WiMax), global system for mobile communication (GSM), code division multiple access (CDMA), Bluetooth, near field communication (NFC), wireless fidelity (WiFi), and radio frequency identification (RFID). The second chip 20 may be implemented with various types of processing chips such as a central processing unit (CPU), a digital signal processor (DSP), and a micro computing unit (MCU).

According to an example embodiment of the inventive concepts, the first chip 10 may include a memory interface device, and the second chip 20 may include a memory device. For example, the first chip 10 may receive write data from an external host, and the first chip 10 may provide read data to the external host. For example, the first chip 10 may receive the write data, and correct the write data by using the equalizing circuit 100. The first chip 10 may output data corrected as the output signal DO via the output terminal OT. The second chip 20 may receive the output signal DO via the input terminal IT. The second chip 20 may perform various types of memory operations such as a read operation, a write operation, and a refresh operation, based on the output signal DO.

According to an example embodiment of the inventive concepts, the first chip 10 may perform data communication with the second chip 20 based on at least one protocol of a peripheral component interconnection (PCI) protocol, a PCI-Express (PCI-E) protocol, an advanced technology attachment (ATA) protocol, a serial-ATA protocol, a parallel-ATA protocol, a small computer small interface (SCSI) protocol, a serial attached SCSI (SAS) protocol, a universal serial bus (USB) protocol, a multi media card (MMC) protocol, an enhanced small disk interface (ESDI) protocol, an integrated drive electronics (IDE) protocol, a mobile industry processor interface (MIPI) protocol, and a universal flash storage (UFS) protocol. The second chip 20 may include a nonvolatile memory such as a flash memory, magnetic RAM (MRAM), ferroelectric RAM (FeRAM), phase change RAM (PRAM), and reactive RAM (ReRAM), and may include dynamic RAM (DRAM) such as double data rate (DDR) synchronous DRAM (SDRAM) (DDR SDRAM), low power (LP) DDR (LPDDR), SDRAM, graphics DDR (GDDR), and rambus DRAM (RDRAM).

As described above, the first chip 10 is illustrated as the RFIC or a memory interface device, and the second chip 20 is illustrated as a processing chip or a memory device, but the example embodiments are not limited thereto. In other words, the first chip 10 and the second chip 20 may be mounted on various types of electronic devices, and the equalizing circuit 100 may correct various types of signals as described below.

According to descriptions given above, an example of communication from the first chip 10 to the second chip 20 has been described, but the example embodiments are not limited thereto, and the second chip 20 may also include the equalizing circuit 100. For example, the data processed by the second chip 20 may be output to the outside via the first chip 10. The second chip 20 may generate the data signal DT as a result of data processing, and the equalizing circuit 100 of the second chip 20 may correct the data signal DT. The data signal DT corrected by the equalizing circuit 100 of the second chip 20 may be output to the first chip 10 as the output signal DO via the input terminal IT of the second chip 20. The first chip 10 may receive the output signal DO via the output terminal OT.

According to an example embodiment of the inventive concepts, the equalizing circuit 100 may correct the data signal DT that is a basis of various types of operation processing. The equalizing circuit 100 may receive the data signal DT, and correct the data signal DT based on a rising edge and a falling edge of the data signal DT. For example, the equalizing circuit 100 may generate a negative pulse signal (for example, PSA in FIG. 5) in response to the falling edge of the received data signal DT. In addition, the equalizing circuit 100 may generate a positive pulse signal (for example, PSB in FIG. 5) in response to the rising edge of the received data signal DT.

When the data signal DT is transmitted through the channel CH, and the capacitance is large due to an large length of the channel CH or a high ESD condition of the electronic device, a gap between a logic high level and a logic low level of the data signal DT may be reduced or a slew rate may be increased. In other words, when the length of the channel CH is large, observation of the data signal DT on an eye diagram may reveal a reduction in eye opening performance, and increases in a rising time and a falling time of the data signal DT. The equalizing circuit 100 may generate a positive pulse signal and a negative pulse signal having a pulse width narrower than a pulse width of the data signal DT in a transition period of the data signal DT (for example, a rising edge generation period and a falling edge generation period) such that difference between the logic high level and the logic low level is increased to improve the eye diagram performance while the original data is not affected. Thereafter, the equalizing circuit 100 may generate the output signal DO having an improved eye diagram performance by inverting the positive pulse signal and the negative pulse signal, and adding the inverted signals with the data signal DT. Accordingly, the equalizing circuit 100 may output the output signal DO having the data signal DT corrected by applying the positive pulse signal and the negative pulse signal to the data signal DT.

Figure 2:
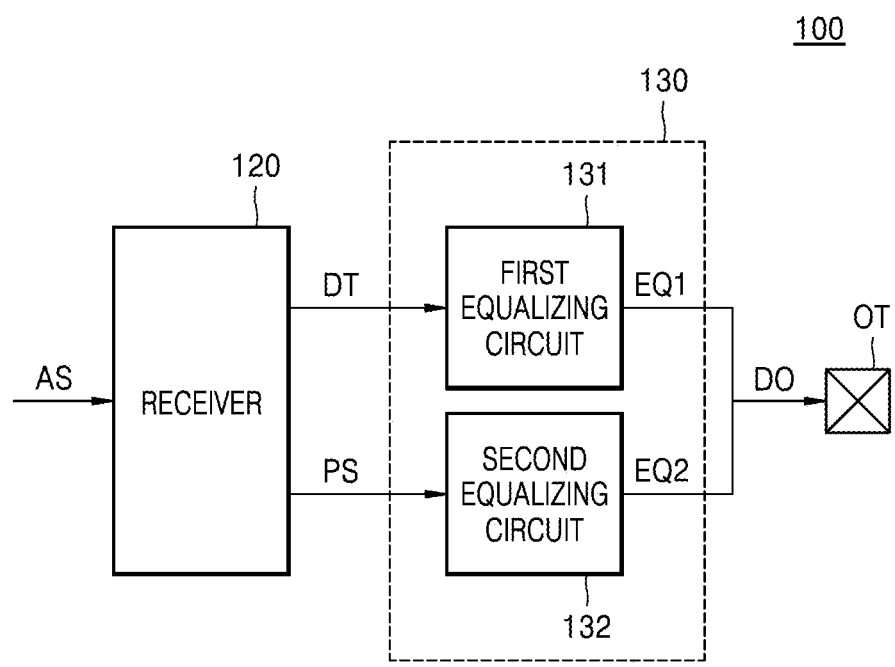
FIGS. 2 and 3 are block diagrams illustrating an equalizing circuit according to example embodiments of the inventive concepts.
Figure 3:
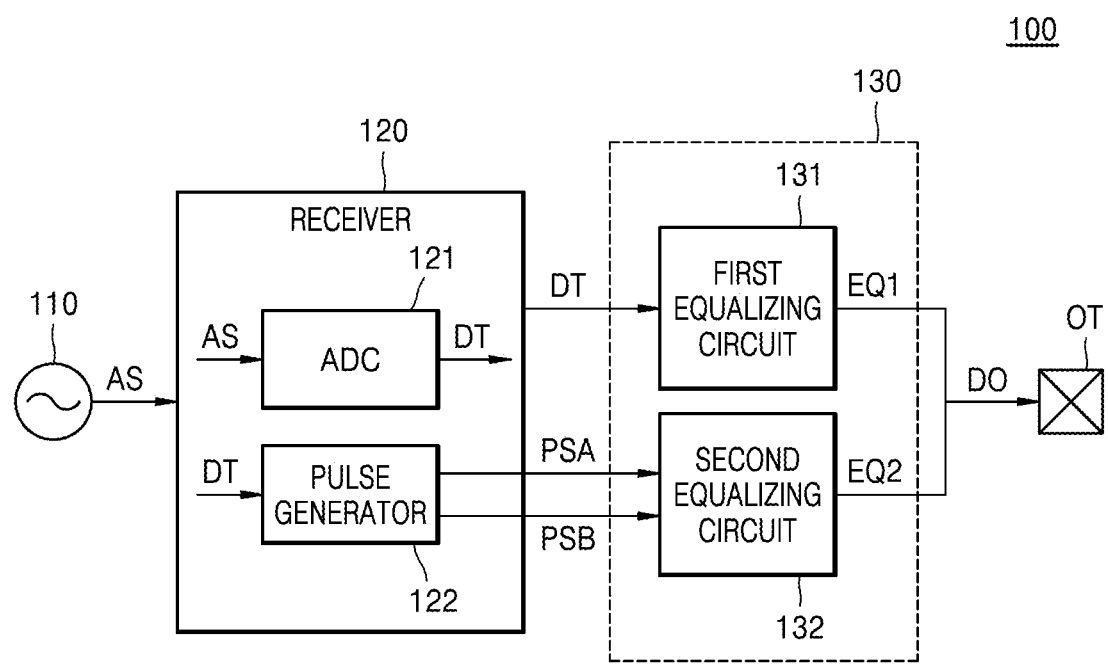

FIGS. 2 and 3 are block diagrams illustrating the equalizing circuit 100 according to example embodiments of the inventive concepts.

Referring to FIG. 2, the equalizing circuit 100 may include a receiver 120, an equalizing module 130, and the output terminal OT. The equalizing circuit 100 may receive an external signal AS and generate the data signal DT based on the external signal AS, and may generate a pulse signal PS based on the external signal AS or the data signal DT. The equalizing circuit 100 may provide the output signal DO having the data signal DT corrected to the output terminal OT, and the equalizing circuit 100 may output the output signal DO via the output terminal OT to the outside.

The receiver 120 may receive the external signal AS and output the data signal DT and the pulse signal PS. For example, the external signal AS may be an analog signal, and the data signal DT may be a signal obtained by converting the external signal AS, which is the analog signal, into a digital signal. This is described with reference to FIG. 3.

Referring to FIG. 3, the receiver 120 may further include an analog-to-digital converter (ADC) 121 and a pulse generator 122. A signal source 110 may be included in the equalizing circuit 100, but the signal source 110 may be an external configuration of the equalizing circuit 100 and the electronic device 1. For example, the signal source 110 may be a base station, an external electronic device, etc.

The ADC 121 may convert an analog signal into a digital signal by various known methods. For example, the external signal AS may be an analog signal. In this case, the ADC 121 may convert the analog signal into a binary digital signal having a logic high level or logic low level with reference to a certain voltage (for example, a logic level of an inverter). However, the example embodiments are not limited thereto, and the ADC 121 may be implemented with various devices, circuits, and logics that convert the external signal AS into a signal that may be processed by the electronic device 1.

The pulse generator 122 may generate a pulse signal (PS in FIG. 2) based on the data signal DT, and the pulse signal PS may include the negative pulse signal PSA and the positive pulse signal PSB. For example, the pulse generator 122 may be implemented with a digital logic circuit. The pulse generator 122 may generate the negative pulse signal PSA and the positive pulse signal PSB by applying a selector using a logic gate such as AND, OR, NOT, NAND, NOR, and XOR, and a plurality of logic gates, and a logic circuit such as a multiplexer and/or an adder, to the data signal DT that is a digital-type signal.

The pulse generator 122 may generate the negative pulse signal PSA having a negative pulse (for example, NP in FIG. 5) at a timing of the falling edge of the data signal DT. For example, the negative pulse signal PSA may have a logic low level and a logic high level, and the negative pulse signal PSA may have a logic low level in response to the falling edge of the data signal DT. In addition, the pulse generator 122 may generate the negative pulse signal PSA having a pulse width less than a pulse width of the data signal DT. As an example, the negative pulse signal PSA may transition (or return) to the logic high level after the certain time, and as another example, the negative pulse signal PSA may transition to the logic high level after the timing at which the falling edge of the data signal DT occurs, and as another example, the negative pulse signal PSA may transition to the logic high level before the timing at which the rising edge of the data signal DT occurs.

The pulse generator 122 may generate the positive pulse signal PSB having a positive pulse at the timing of the rising edge of the data signal DT. For example, the positive pulse signal PSB may have the logic low level and the logic high level, and the positive pulse signal PSB may have the logic low level in response to the rising edge of the data signal DT. In addition, the pulse generator 122 may generate the positive pulse signal PSB having a pulse width less than the pulse width of the data signal DT. As an example, the positive pulse signal PSB may transition (or return) to the logic low level after the certain time, and as another example, the positive pulse signal PSB may transition to the logic low level after the timing at which the rising edge of the data signal DT occurs, and as another example, the positive pulse signal PSB may transition to the logic low level before the timing at which the falling edge of the data signal DT occurs.

Each of the negative pulse signal PSA and the positive pulse signal PSB may have the negative pulse NP and a positive pulse as described above. For example, a pulse width of the negative pulse NP constituting the negative pulse signal PSA may be less than the pulse width of the data signal DT. For example, a pulse width of the positive pulse constituting the positive pulse signal PSB may be less than the pulse width of the data signal DT. This is described below in detail with reference to FIG. 5.

Referring again to FIG. 2, the equalizing module 130 may include a first equalizing circuit 131 and a second equalizing circuit 132. For example, the first equalizing circuit 131 and the second equalizing circuit 132 may be implemented with a plurality of transistors, respectively. For example, the first equalizing circuit 131 may include an inverter circuit or a buffer circuit including a plurality of transistors, and the second equalizing circuit 132 may include an inverter circuit or a buffer circuit including a plurality of transistors.

The first equalizing circuit 131 may receive the data signal DT and output a first equalizing signal EQ1 in which a phase of the data signal DT is inverted. For example, the first equalizing circuit 131 may include an inverter circuit. The first equalizing circuit 131 may receive the data signal DT and generate the first equalizing signal EQ1 having a level of a driving voltage at a logic low level of the data signal DT. For example, the driving voltage may be a voltage applied to the first equalizing circuit 131 from a voltage generator outside the equalizing circuit 100. In addition, the first equalizing circuit 131 may generate the first equalizing signal EQ1 having the level of the ground voltage at the logic high level of the data signal DT. For example, the ground voltage may be a voltage of a ground line to which the first equalizing circuit 131 is connected. In other words, the first equalizing signal EQ1 may be a signal having the level of the driving voltage and the level of the ground voltage. The second equalizing circuit 132 may receive the pulse signal PS and output a second equalizing signal EQ2 by inverting the received pulse signal PS. For example, the second equalizing circuit 132 may also include an inverter circuit. For example, the second equalizing circuit 132 may invert the negative pulse signal PSA, invert the positive pulse signal PSB, sum the two inverted signals (PSA and PSB), and output the summed signal as the second equalizing signal EQ2.

According to another example embodiment of the inventive concepts, the first equalizing signal EQ1 may be substantially the same as the data signal DT. For example, a phase of the first equalizing signal EQ1 may be the same as the phase of the data signal DT. In this case, the first equalizing circuit 131 may include a buffer circuit, and the first equalizing signal EQ1 may have the same phase as a logic level of the data signal DT. When the first equalizing circuit 131 includes a buffer circuit, the second equalizing circuit 132 may also include a buffer circuit. The amplitude of the first equalizing signal EQ1 may also be the same as that of the data signal DT. Alternatively, the first equalizing signal EQ1 may be a logic signal of any voltage level. The second equalizing circuit 132 may receive and sum the negative pulse signal PSA and the positive pulse signal PSB, invert the summed signal, and output the inverted signal as the second equalizing signal EQ2.

According to an example embodiment of the inventive concepts, the sizes of the rising edge and the falling edge of the data signal DT may be increased by using a signal having a pulse in the same direction as an edge direction of the data signal DT. In other words, the equalizing module 130 may compensate for the edge size of the data signal DT. For example, a size of the rising edge of the output data signal DO output by the equalizing module 130 may be greater than a size of the falling edge of the data signal DT, and the size of the falling edge of the data signal DO may be greater than the size of the rising edge of the data signal DT. However, the example embodiments are not limited thereto, and the sizes of the rising edge and the falling edge of the output data signal DO may be greater than the sizes of the rising edge and the falling edge of the data signal DT, respectively.

The equalizing module 130 may output the output signal DO to the output terminal OT by summing the first equalizing signal EQ1 and the second equalizing signal EQ2. The output terminal OT may provide the output signal DO to a channel (for example, CH in FIG. 1), and the output signal DO may be transmitted to an external configuration through the channel. For example, the output terminal OT may be implemented in various forms such as a data pin and a data pad.

The output signal DO may be a signal in which difference between a logic high level and a logic low level of the first equalizing signal EQ1 based on the data signal DT is increased. In other words, the output signal DO may have a difference greater than a difference between the logic high level and the logic low level of the data signal DT. Accordingly, the output signal DO may have an inter-symbol interference (ISI) value less than the ISI value of the data signal DT. In other words, the eye opening performance on the eye diagram may be improved.

Figure 4:
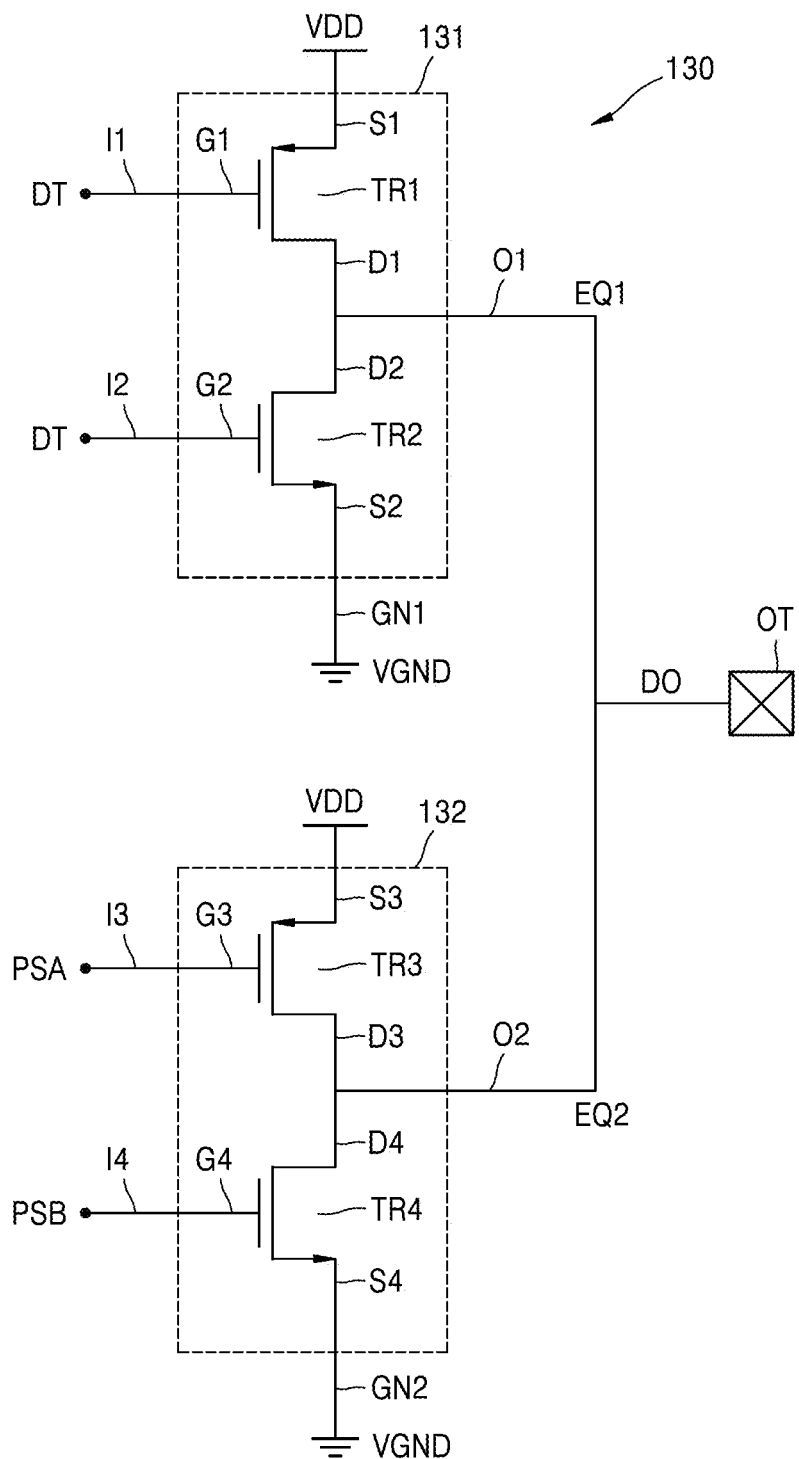
FIG. 4 is a circuit diagram illustrating an equalizing module and an output terminal, according to an example embodiment of the inventive concepts.

FIG. 4 is a circuit diagram illustrating the equalizing module 130 and the output terminal OT, according to an example embodiment of the inventive concepts.

Referring to FIG. 4, the equalizing module 130 may include the first equalizing circuit 131 and the second equalizing circuit 132. The first equalizing circuit 131 may further include a first transistor TR1 and a second transistor TR2, and the second equalizing circuit 132 may further include a third transistor TR3 and a fourth transistor TR4. For example, the first equalizing circuit 131 may include an inverter or a buffer circuit including the first transistor TR1 and the second transistor TR2. In addition, the second equalizing circuit 132 may include an inverter circuit or a buffer circuit including the third transistor TR3 and the fourth transistor TR4.

According to an example embodiment of the inventive concepts, the first transistor TR1 and the third transistor TR3 may include p-type metal oxide semiconductor (PMOS) transistors, and the second transistor TR2 and the fourth transistor TR4 may include n-type metal oxide semiconductor (NMOS) transistors. However, the example embodiments are not limited thereto, and each of the first through fourth transistors TR1 through TR4 may include a PMOS or an NMOS transistor.

The first equalizing circuit 131 may include two input terminals (I1 and I2) and one first output terminal O1. Each of the input terminals (I1 and I2) may receive the data signal DT together. In other words, a first gate terminal G1 of the first transistor TR1 and a second gate terminal G2 of the second transistor TR2 may receive the data signal DT.

The first transistor TR1 may have a first source terminal S1 receiving a driving voltage VDD, a first drain terminal D1 connected to the first output terminal O1, and the first gate terminal G1 connected to the first input terminal I1. The second transistor TR2 may include a second drain terminal D2 connected to the output terminal OT, a second source terminal S2 connected to a first ground node GN1, and the second gate terminal G2 connected to the second input terminal I2.

The first equalizing circuit 131 may selectively receive the driving voltage VDD or a ground voltage VGND according to the logic high level and the logic low level of the data signal DT. For example, in response to generation of the logic low level of the data signal DT, the first equalizing signal EQ1 may be generated. In this case, a magnitude of the logic high level of the first equalizing signal EQ1 may be based on a level of the driving voltage VDD. In addition, in response to generation of the logic high level of the data signal DT, the first equalizing signal EQ1 may be generated. In this case, a magnitude of the logic high level of the first equalizing signal EQ1 may be based on the level of the driving voltage VDD. For example, the level of the driving voltage VDD may be greater than the level of the ground voltage VGND.

The first equalizing signal EQ1 may be a voltage signal having the logic high level based on the driving voltage VDD and the logic low level based on the ground voltage VGND. For example, the logic high level of the first equalizing signal EQ1 may be substantially the same as the level of the driving voltage VDD. As another example, the logic high level of the first equalizing signal EQ1 may be the same as that of the data signal DT. As another example, the logic high level of the first equalizing signal EQ1 may be a level at which a coefficient regarding device characteristics of the first transistor TR1 is applied to the driving voltage VDD.

The logic low level of the first equalizing signal EQ1 may be substantially the same as the level of the ground voltage VGND. As another example, the logic low level of the first equalizing signal EQ1 may be the same as that of the data signal DT. As another example, the logic low level of the first equalizing signal EQ1 may be a level at which a coefficient regarding device characteristics of the second transistor TR2 is applied to the ground voltage VGND.

The second equalizing circuit 132 may include two input terminals (I3 and I4) and one second output terminal O2. Each of the input terminals (I3 and I4) may receive the negative pulse signal PSA and the positive pulse signal PSB. In other words, a third gate terminal G3 of the third transistor TR3 and a fourth gate terminal G4 of the fourth transistor TR4 may receive the negative pulse signal PSA and the positive pulse signal PSB, respectively.

According to an example embodiment of the inventive concepts, the third transistor TR3 may include a third source terminal S3 receiving the driving voltage VDD and a third drain terminal D3 connected to the second output terminal O2 of the second equalizing circuit 132. For example, the third transistor TR3 may include a p-type transistor. The fourth transistor TR4 may include a fourth source terminal S4 connected to a second ground node GN2 and a fourth drain terminal D4 connected to the second output terminal O2 of the second equalizing circuit 132.

The second equalizing circuit 132 may selectively receive the driving voltage VDD or the ground voltage VGND according to the logic high level and the logic low level of the negative pulse signal PSA and the positive pulse signal PSB, and accordingly, may generate the second equalizing signal EQ2. The equalizing module 130 may sum the first equalizing signal EQ1 and the second equalizing signal EQ2, and by using the summed signal, may output the output signal DO to the output terminal OT. The second equalizing signal EQ2 and the output signal OT are described in detail later with reference to FIG. 5.

The output terminal OT may be connected to the first equalizing circuit 131 and the second equalizing circuit 132 via wires and may be connected to a channel (CH in FIG. 1) for transmitting the output signal OT to an external device.

Figure 5:
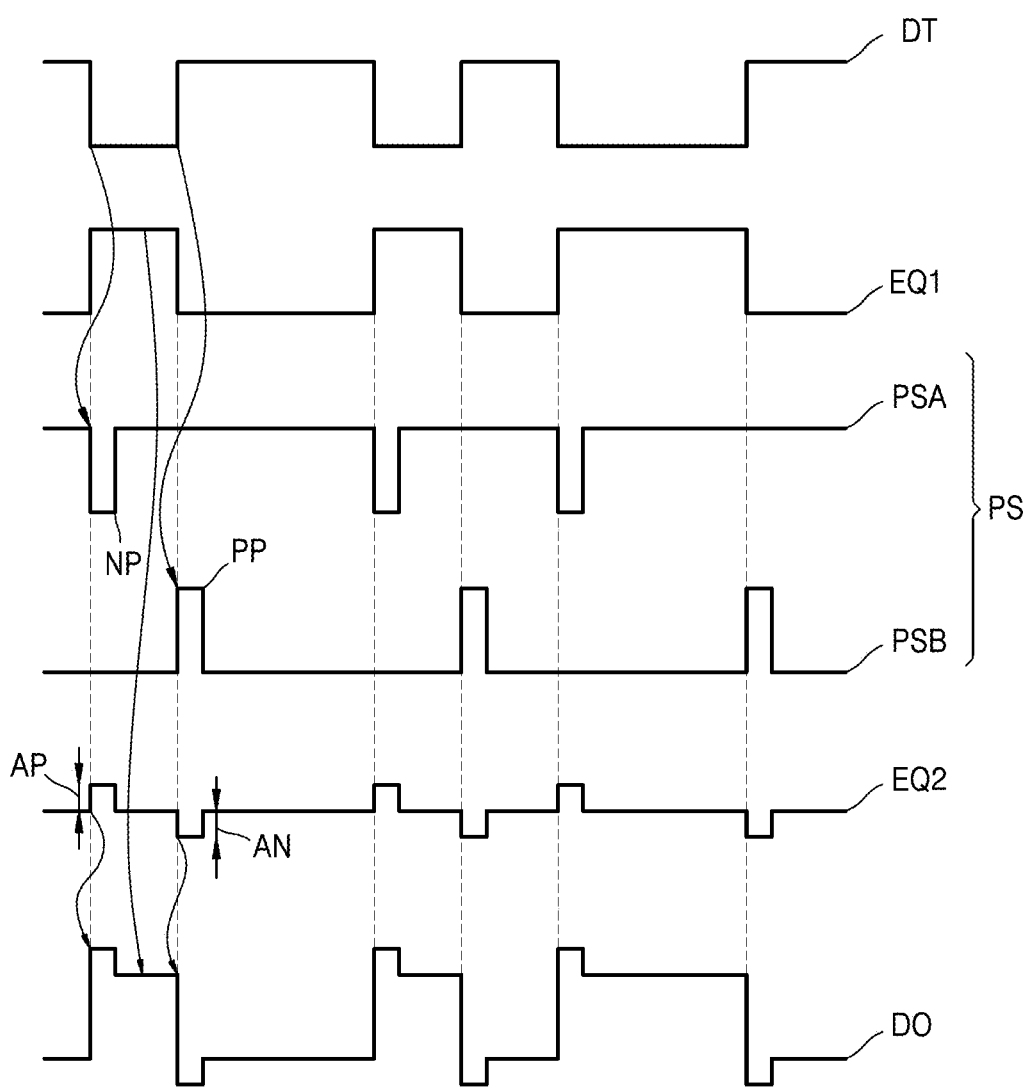
FIG. 5 is a timing diagram of signals according to an example embodiment of the inventive concepts.

FIG. 5 is a timing diagram of signals according to an example embodiment of the inventive concepts. Hereinafter, descriptions are given with reference to reference numbers in FIGS. 3 and 4.

Referring to FIG. 5, the data signal DT may be a digital signal having a logic high level and a logic low level. For example, the logic high level of the data signal DT may indicate a data value of '1', and the logic low level may indicate a data value of '0'.

The first equalizing signal EQ1 may be a voltage signal in which the data signal DT is inverted. For example, the magnitude of the first equalizing signal EQ1 may be determined based on parameters or levels of the driving voltage VDD and the ground voltage VGND according to an element included in the first equalizing circuit 131. As an example, the magnitude of the logic high level of the first equalizing signal EQ1 may be determined based on the level of the driving voltage VDD. As another example, the magnitude of the logic low level of the first equalizing signal EQ1 may be determined based on the level of the ground voltage VGND.

The pulse signal PS may include the negative pulse signal PSA and the positive pulse signal PSB. The negative pulse signal PSA and the positive pulse signal PSB may include the negative pulses NP and positive pulses PP, respectively. The negative pulse NP may be referred to as a logic low level pulse that appears in the negative pulse signal PSA. In addition, as illustrated, the pulse width of the negative pulse NP may be less than the pulse width of the data signal DT. Similarly, the positive pulse PP may be referred to as a logic high level pulse that appears in the positive pulse signal PSB, and the pulse width of the positive pulse PP may be less than the pulse width of the data signal DT. For example, the pulse width of at least one of the negative pulse NP and the positive pulse PP may be less than half of the pulse width of the data signal DT. In other words, at least one of the negative pulse NP and the positive pulse PP may have a very narrow pulse width compared with the data signal DT.

The negative pulse signal PSA may be generated in response to generation of the falling edge of the data signal DT. The positive pulse signal PSB may be generated in response to generation of the rising edge of the data signal DT. For example, the pulse generator 122 may generate the negative pulse signal PSA and the positive pulse signal PSB from the data signal DT by using a plurality of logic gates. For example, the magnitude of the logic high level of each of the negative pulse signal PSA and the positive pulse signal PSB may be substantially the same as the magnitude of the logic high level of the data signal DT.

The second equalizing signal EQ2 may be generated based on a result of inverting the pulse signal PS. For example, the second equalizing circuit 132 may sum the first negative pulse signal PSA and the second negative pulse signal PSB, invert the summed signal, and generate the inverted signal into the second equalizing signal EQ2.

A logic high level AP of the second equalizing signal EQ2 may be generated based on the negative pulse NP. For example, the logic high level AP of the second equalizing signal EQ2 may have a magnitude in which device characteristics of the second equalizing circuit 132 are reflected in a voltage level of the negative pulse NP. The magnitude of the logic high level AP may be less than the magnitude of the negative pulse NP. As another example, a logic low level AN of the second equalizing signal EQ2 may have a magnitude in which device characteristics of the second equalizing circuit 132 are reflected in the voltage level of the negative pulse NP. The magnitude of the logic low level AN may be less than the magnitude of the positive pulse PP.

The output signal DO may be a signal obtained by summing the first equalizing signal EQ1 and the second equalizing signal EQ2. For example, the equalizing module 130 may transmit the first equalizing signal EQ1 output from the first equalizing circuit 131 and the second equalizing signal EQ2 output from the second equalizing circuit 132 to the output terminal OT via the same output line.

According to an example embodiment of the inventive concepts, as the output signal DO increases the magnitudes of the rising edge and the falling edge of the data signal DT, distortion in a process of converting an analog signal into a digital signal may not easily occur, and accordingly, a signal accuracy may be increased.

According to an example embodiment of the inventive concepts, the second equalizing circuit 132 may adjust magnitudes of amplitudes (that is, AP and AN) of the second equalizing signal EQ2. The second equalizing circuit 132 may adjust the magnitudes of the amplitudes (AP and AN) by applying a certain gain to an amplitude of the pulse signal PS. For example, a gain may be determined by device characteristics of the transistors (TR3 and TR4) included in the second equalizing circuit 132. As another example, the second equalizing circuit 132 may vary the gain by using various external voltages, external signals, and external currents including the driving voltage VDD and the ground voltage VGN.

Figure 6:
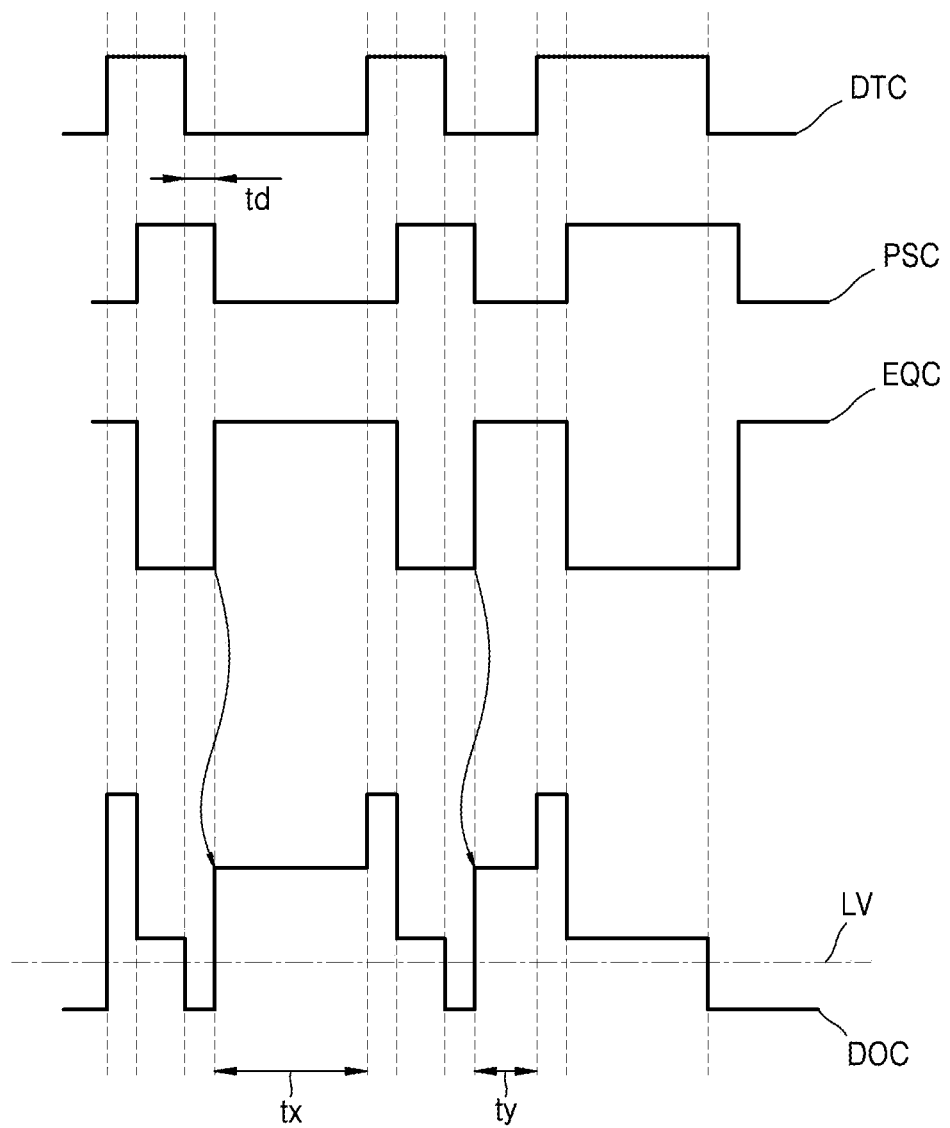
FIG. 6 is a timing diagram for describing signals for correcting data signals according to a comparative example.

FIG. 6 is a timing diagram for describing signals for correcting data signals according to a comparative example. FIG. 6 is a diagram for explaining advantages of the signal processing described above with reference to FIG. 5.

Referring to FIG. 6, the input data DTC may be a digital signal, and a delay signal PSC may be a signal obtained by delaying the input data DTC by a certain time td. A compensation signal EQC may be a signal obtained by inverting and increasing the amplitude of the delay signal PSC. In this case, a distortion correction signal DOC may be generated by summing the input data DTC with the compensation signal EQC. The distortion correction signal DOC may be a signal corrected to prevent distortion of the input data DTC. In this case, when the amplitude of the compensation signal EQC is excessively increased, a digital value indicated by the input data DTC, that is, the original data, may not be maintained. For example, in a time period tx and a time period ty, the input data DTC or the original data may indicate the digital value of '0', but the distortion correction signal DOC may incorrectly indicate the digital value of '1'. In other words, when the amplitude of the compensation signal EQC is increased beyond a certain limit, data of the distortion correction signal DOC may be distorted.

In contrast, referring back to FIG. 5, in one or more example embodiments, the pulse signal PS and the second equalizing signal EQ2 may output the pulse signals only in a period in which the rising edge and the falling edge occur. Accordingly, the output signal DO may accurately indicate a digital data value indicated by the data signal DT, or the original data, and since the magnitude of the edge of the output signal DO is large, the ISI may be reduced and the eye opening performance may be improved.

Figure 7:
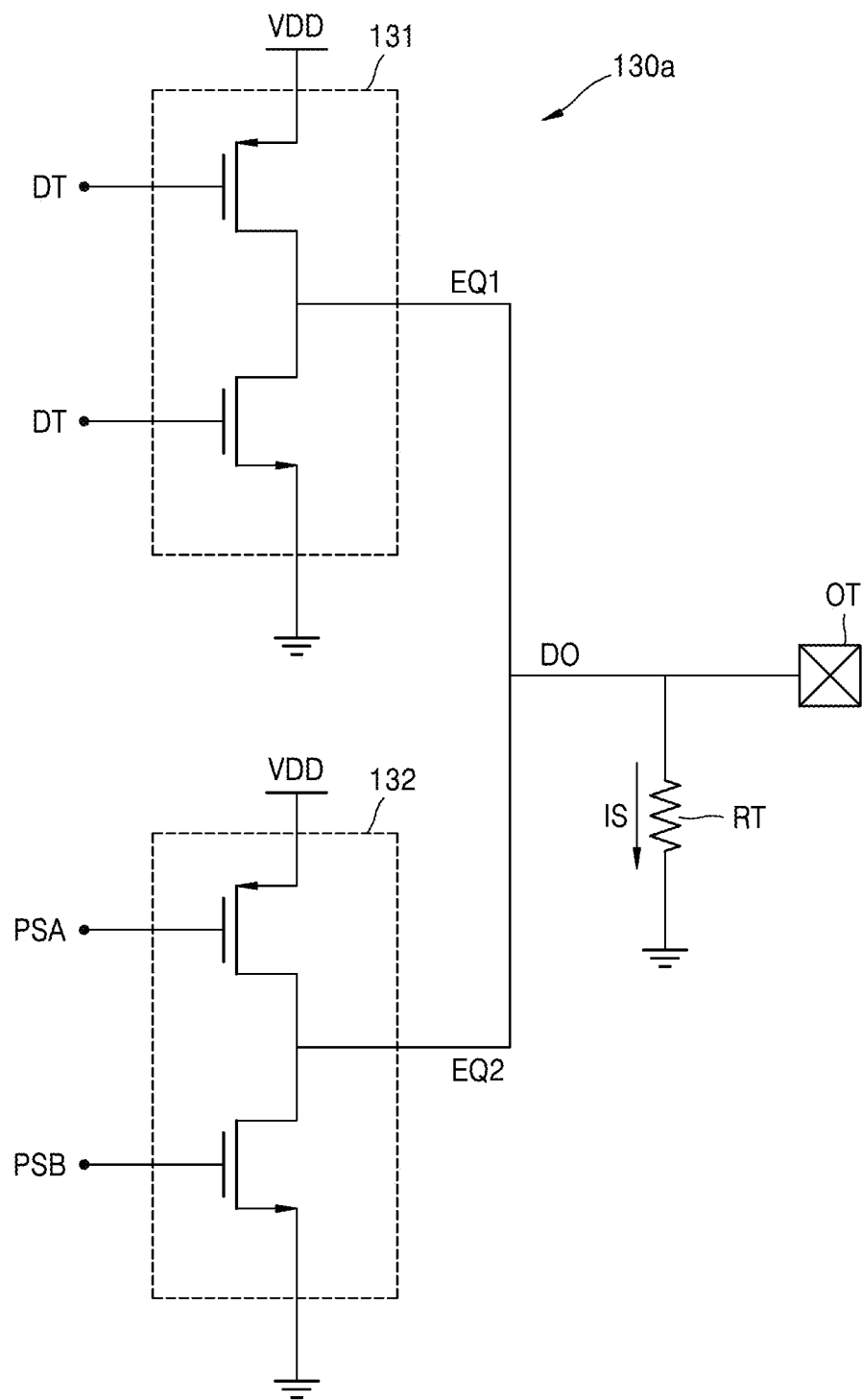
FIG. 7 is a circuit diagram illustrating a source voltage termination according to an example embodiment of the inventive concept.
Figure 8:
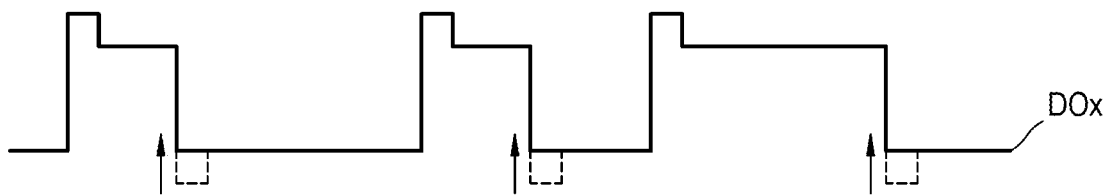
FIG. 8 is a waveform diagram illustrating an output voltage according to an example embodiment of the inventive concepts.

FIG. 7 is a circuit diagram illustrating a source voltage termination according to an example embodiment of the inventive concepts, and FIG. 8 is a waveform diagram illustrating an output voltage according to an example embodiment of the inventive concepts. Hereinafter, descriptions are given with reference to reference numbers in FIG. 1.

Referring to FIG. 7, the electronic device 1 may further include a termination resistor RT. The termination resistor RT may be connected to the output terminal OT and an equalizing circuit 130a. In other words, the electronic device 1 may implement the source voltage termination (Vss termination).

According to an example embodiment of the inventive concepts, when the digital value of the data signal DT indicates '0', the voltage level of the output signal DO may be about 0. In this case, all of voltages applied to both ends of the termination resistor RT may be about 0 V. Accordingly, a magnitude of a constant current IS flowing through the termination resistor RT may be about 0, and accordingly, power consumption may be prevented when there is no input data (that is, when the input data is continuously about 0 or null).

Referring to FIG. 8, when the data input to the electronic device 1 is about 0 as described above, the source voltage termination may prevent the power consumption. However, as a trade off condition, the voltage level of the output signal DO may not be reduced to a negative level. As described above with reference to FIGS. 1 through 6, when the output signal DO has a negative level in a certain period, the difference between the edges may be increased, but the output signal DO may not have a negative level due to the source voltage termination.

Figure 9:
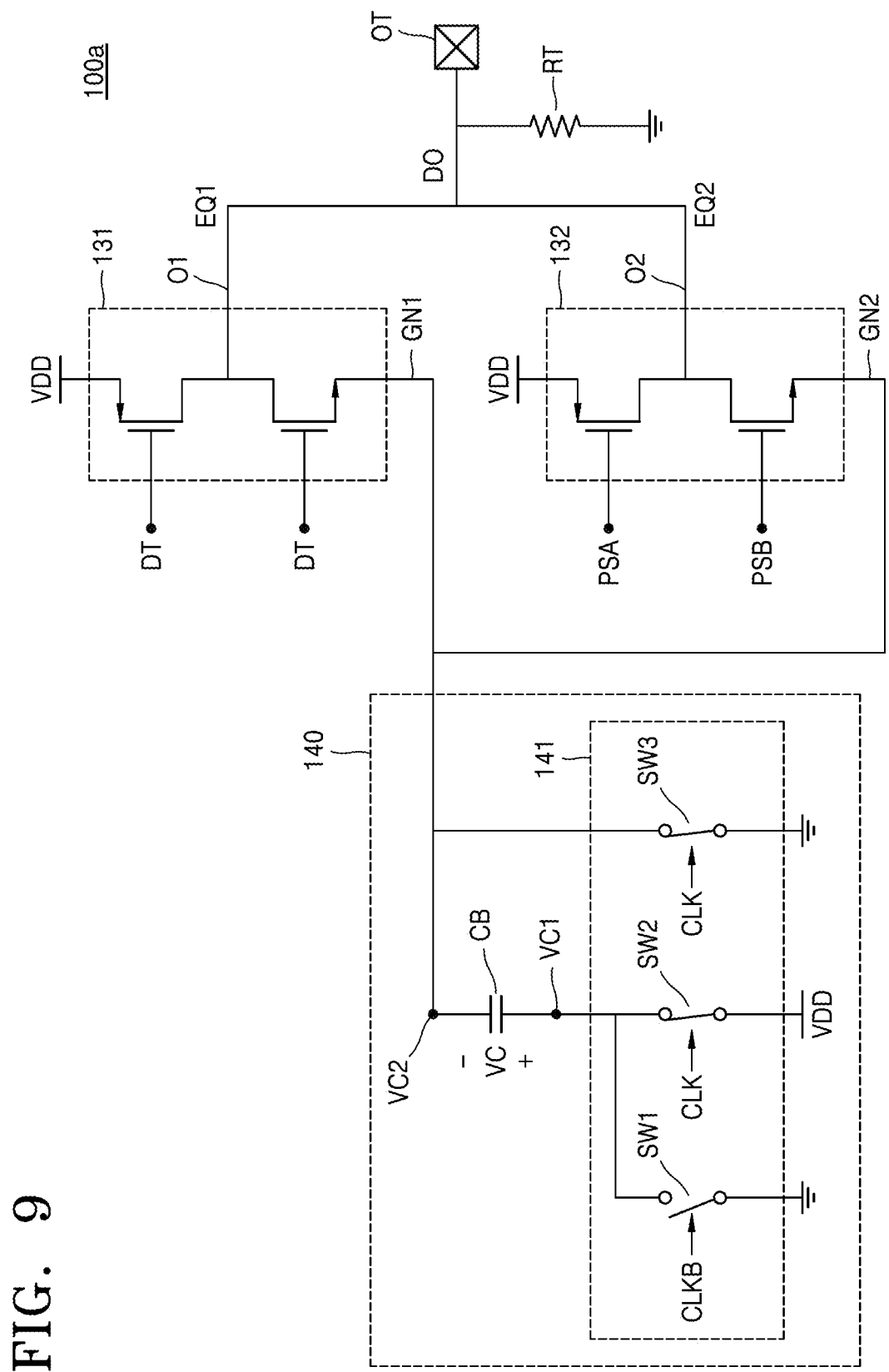
FIG. 9 is a circuit diagram illustrating a pull-down circuit according to an example embodiment of the inventive concepts.

FIG. 9 is a circuit diagram illustrating a pull-down circuit according to an example embodiment of the inventive concepts. Hereinafter, descriptions are given with reference to reference numbers in FIG. 3.

Referring to FIG. 9, an equalizing circuit 100a may further include a pull-down circuit 140. The pull-down circuit 140 may be connected to at least one of the first equalizing circuit 131 and the second equalizing circuit 132 and may provide a negative level voltage to at least one of the first ground node GN1 of the first equalizing circuit 131 and the second ground node GN2 of the second equalizing circuit 132. As described above with reference to FIG. 8, when the source voltage termination by the termination resistor RT is included in the electronic device 1, the output signal DO may not have the negative level voltage. Accordingly, the pull-down circuit 140 may instantaneously gen-erate the negative pulse of the output signal DO by applying the negative level voltage to the equalizing module 130.

The pull-down circuit 140 may include a switching circuit 141 including a plurality of switches (SW1 through SW3) and a capacitor CB. One end of the capacitor CB (for example, a node to which a voltage VC1 is applied) may be connected to the switching circuit 141, and the other end of the capacitor CB (for example, a node to which a voltage VC2 is applied) may be connected to the first ground node GN1 of the first equalizing circuit 131 and the second ground node GN2 of the second equalizing circuit 132.

The switching circuit 141 may receive a clock signal CLK and a complementary clock signal CLKB, and the complementary clock signal CLKB may be a signal in which the clock signal CLK is inverted. The switches (SW1 through SW3) may perform a switching operation (for example, turn-on or turn-off) based on logic levels of the clock signal CLK and the complementary clock signal CLKB.

The switching circuit 141 may output a driving voltage or a ground voltage according to the turn-on or the turn-off of the plurality of switches (SW1 through SW3). For example, when the clock signal CLK is at a logic high level, the second switch SW2 and the third switch SW3 may be shorted, and the switching circuit 141 may apply the driving voltage VDD to the capacitor CB. In this case, the level of the voltage VC1 of one end of the capacitor CB may be the level of the driving voltage VDD, and a level of a voltage VC2 of the other end of the capacitor CB may be the level of the ground voltage. In other words, the capacitor CB may be charged based on the driving voltage VDD. When the clock signal CLK is at a logic low level, the first switch SW1 may be shorted. In this case, the level of the voltage VC1 of one end of the capacitor CB may be the level of the ground voltage. Due to the charge conservation law of the capacitor CB, the level of the voltage at the other end of the capacitor CB may be a negative level (for example, −VDD). Accordingly, the pull-down circuit 140 may output the negative level voltage to the first ground node GN1 and the second ground node GN2.

The clock signal CLK and the complementary clock signal CLKB may be received from, for example, the pulse generator 122 of FIG. 3, and as another example, may be received from a clock generator inside the electronic device 1, and as another example, may be received from the outside of the electronic device 1.

Figure 10:
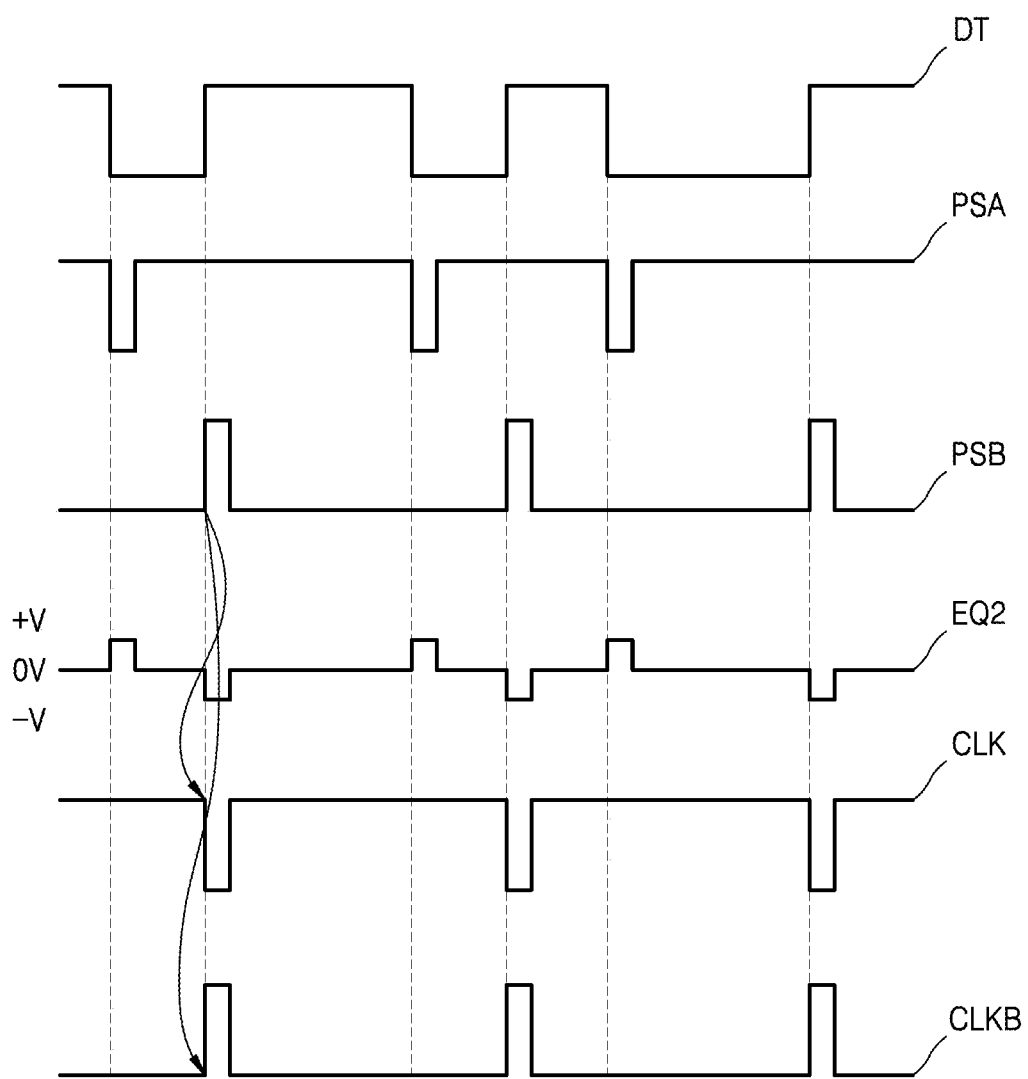
FIGS. 10 and 11 are timing diagrams for describing signals and voltages, according to example embodiments of the inventive concepts.
Figure 11:
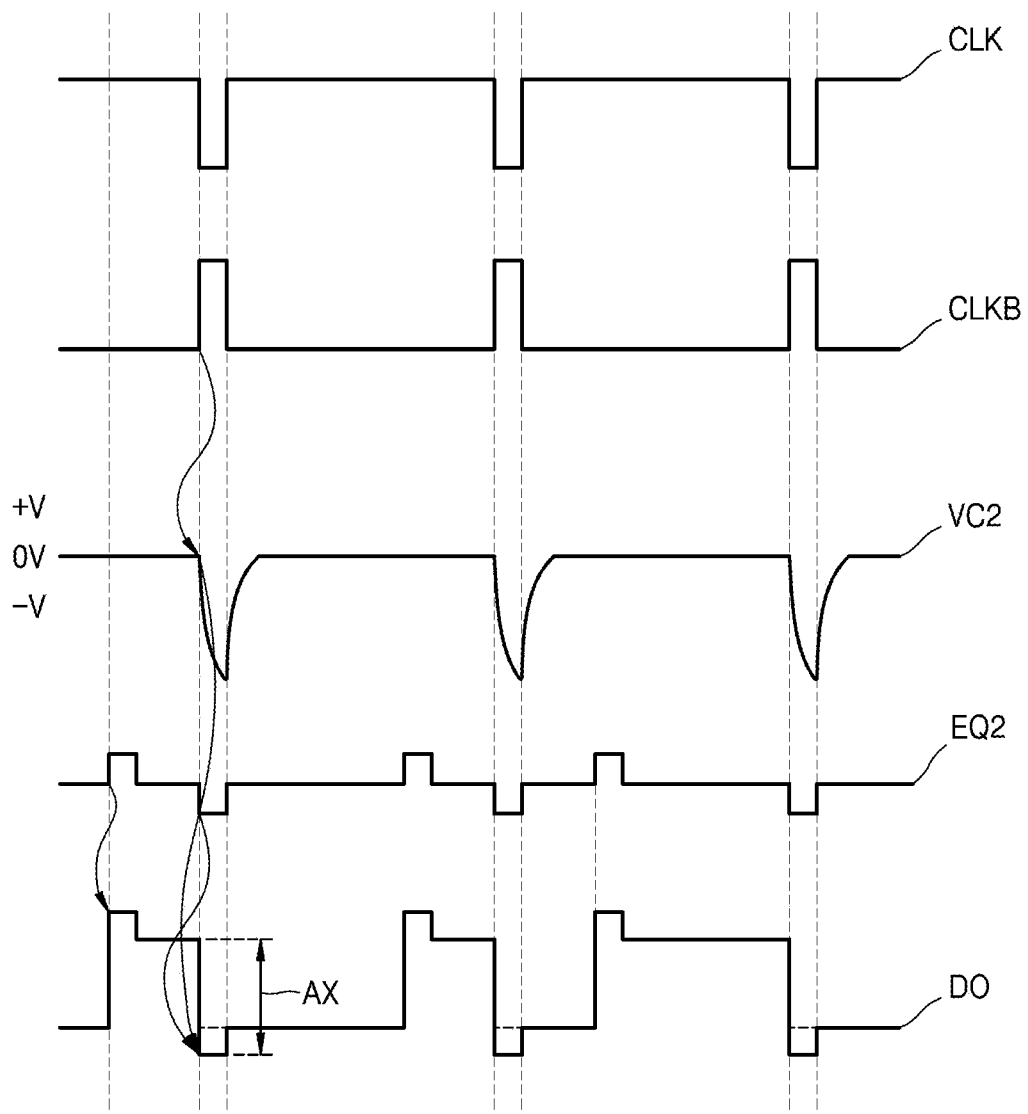

FIGS. 10 and 11 are timing diagrams for describing signals and voltages, according to example embodiments of the inventive concepts.

Referring to FIGS. 3, 9, and 10, the pull-down circuit 140 may receive the clock signal CLK and the complementary clock signal CLKB. For example, the pulse generator 122 may output the clock signal CLK and the complementary clock signal CLKB. The pulse generator 122 may receive the positive pulse signal PSB and generate the clock signal CLK that is transitioned to a logic low level in response to the positive pulse signal PSB having been transitioned to the logic high level. The pulse generator 122 may generate the complementary clock signal CLKB by inverting the clock signal CLK.

Referring to FIGS. 9 and 11, in response to a logic high level of the complementary clock signal CLKB or a logic low level of the clock signal CLK, the voltage VC2 of the other end of the capacitor CB may decrease to a negative level. When the level of the voltage VC2 decreases to the negative level, the first ground node GN1 of the first equalizing circuit 131 and the second ground node GN2 of the second equalizing circuit 132 that are connected to the other end of the capacitor CB may have a negative level voltage. In other words, when the level of the voltage VC2 decreases to a negative level, the second equalizing signal EQ2 may have a negative level. Accordingly, the output signal DO output by the first equalizing circuit 131 and the second equalizing circuit 132 may have a negative level when the clock signal CLK is transitioned to a logic low level. As the difference AX of the edge of the output signal DO increases, the ISI of the electronic device 1 may be reduced, and accordingly, the eye opening performance may be improved.

Figure 12:
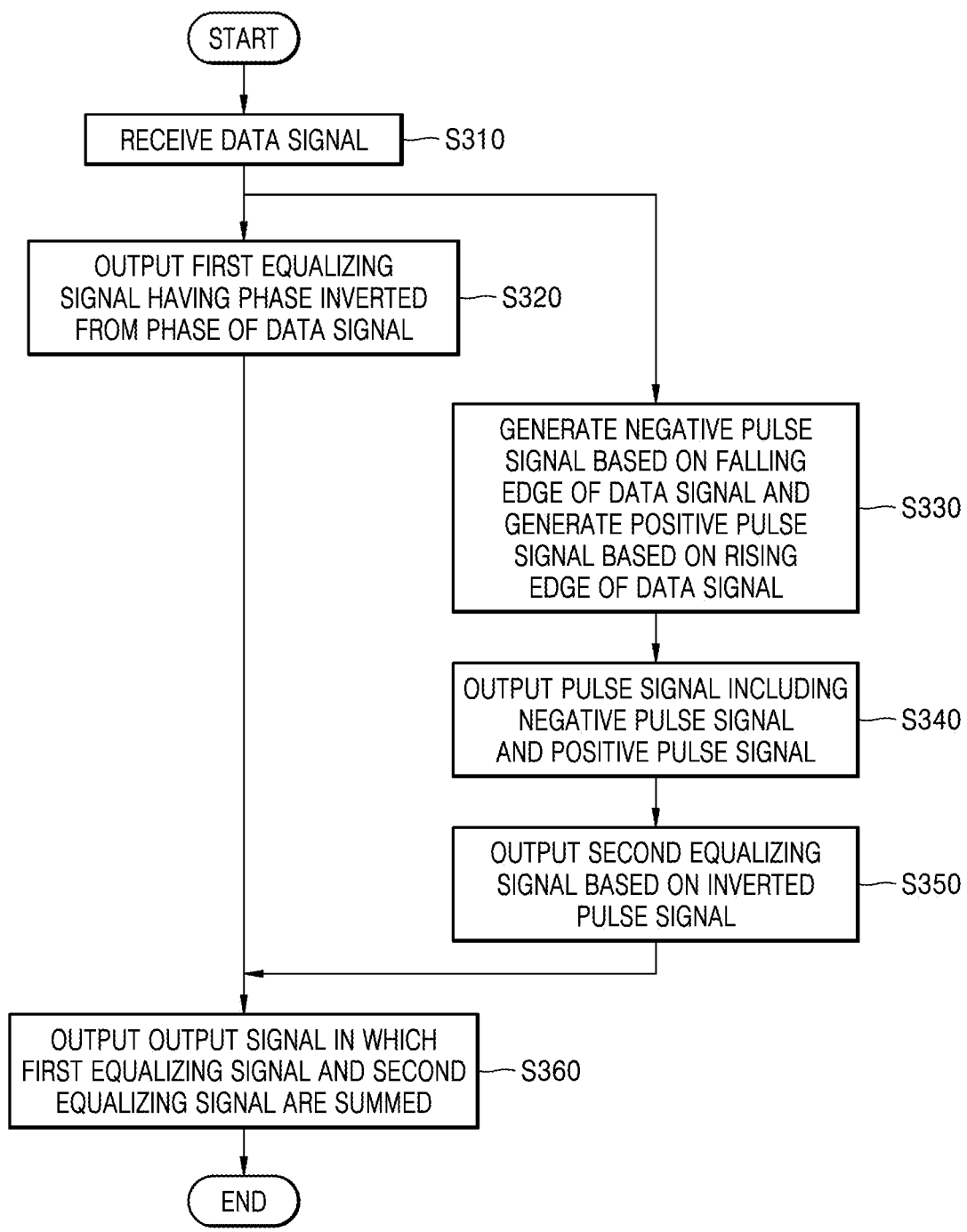
FIG. 12 is a flow chart of an operation method of an electronic device, according to an example embodiment of the inventive concepts.

FIG. 12 is a flowchart of an operation method of the electronic device 1, according to an example embodiment of the inventive concepts. Hereinafter, descriptions are given with reference numbers with reference to the above-described drawings.

In operation S310, the electronic device 1 according to an example embodiment of the inventive concepts may receive the data signal DT.

In operation S320, the first equalizing circuit 131 may output the first equalizing signal EQ1 having a phase in which a phase of the data signal DT is inverted.

In operation S330, the pulse generator 122 may generate the negative pulse signal PSA, based on the falling edge of the data signal DT, and generate the positive pulse signal PSB based on the rising edge of the data signal DT.

In operation S340, the pulse generator 122 may output the pulse signal PS including the negative pulse signal PSA and the positive pulse signal PSB.

In operation S350, the second equalizing circuit 132 may invert the pulse signal PS and output the second equalizing signal EQ2 based on the inverted pulse signal.

Accordingly, in operation S360, the equalizing module 130 may output the output signal DO in which the first equalizing signal EQ1 and the second equalizing signal EQ2 have been summed.

Figure 13:
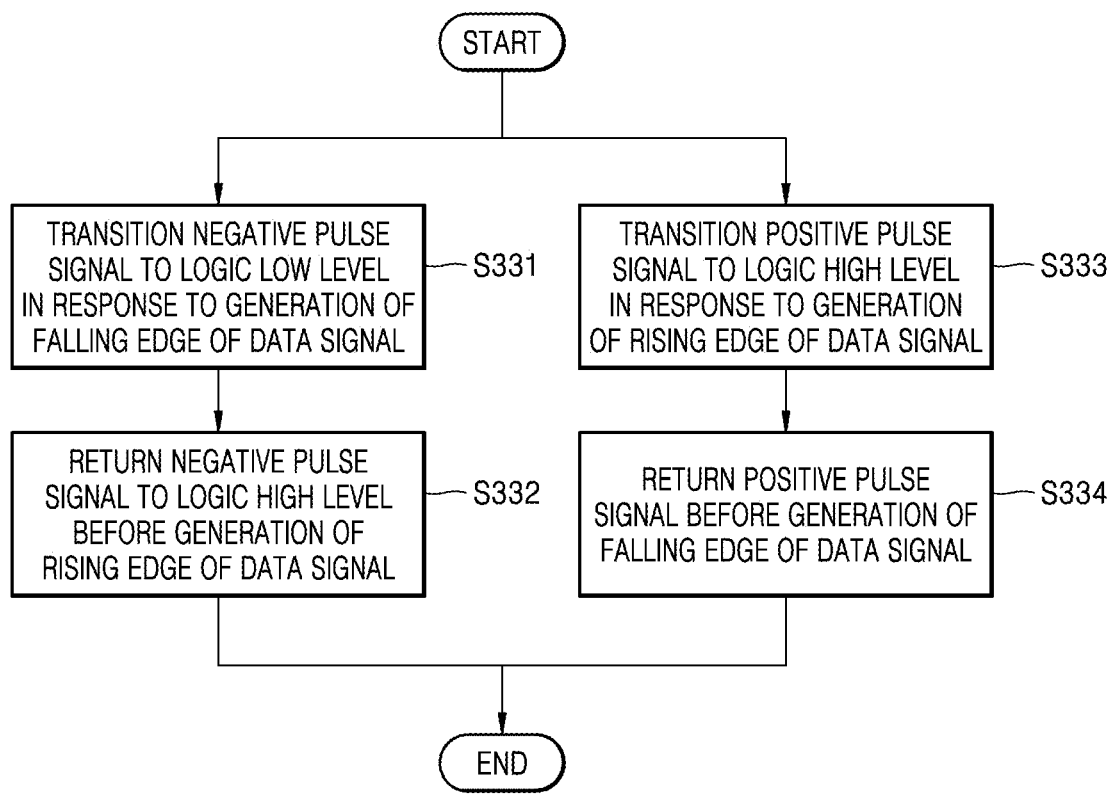
FIG. 13 is a flow chart of an operation method of an electronic device, according to an example embodiment of the inventive concepts.

FIG. 13 is a flowchart of an operation method of the electronic device 1, according to an example embodiment of the inventive concepts. Hereinafter, descriptions are given with reference numbers with reference to the above-described drawings.

Referring to FIG. 13, in operation S331, the pulse generator 122 according to an example embodiment of the inventive concepts may transition the negative pulse signal PSA to a logic low level in response to generation of the falling edge of the data signal DT.

In addition, in operation S332, the pulse generator 122 may restore the negative pulse signal PSA to the logic high level before the rising edge of the data signal DT is generated. In response to generation of the rising edge of the data signal DT, in operation S333, the electronic device 1 may transition the positive pulse signal PSB to the logic high level. In addition, in operation S334, before the falling edge of the data signal DT is generated, the positive pulse signal PSB may be returned to the logic low level.

Figure 14:
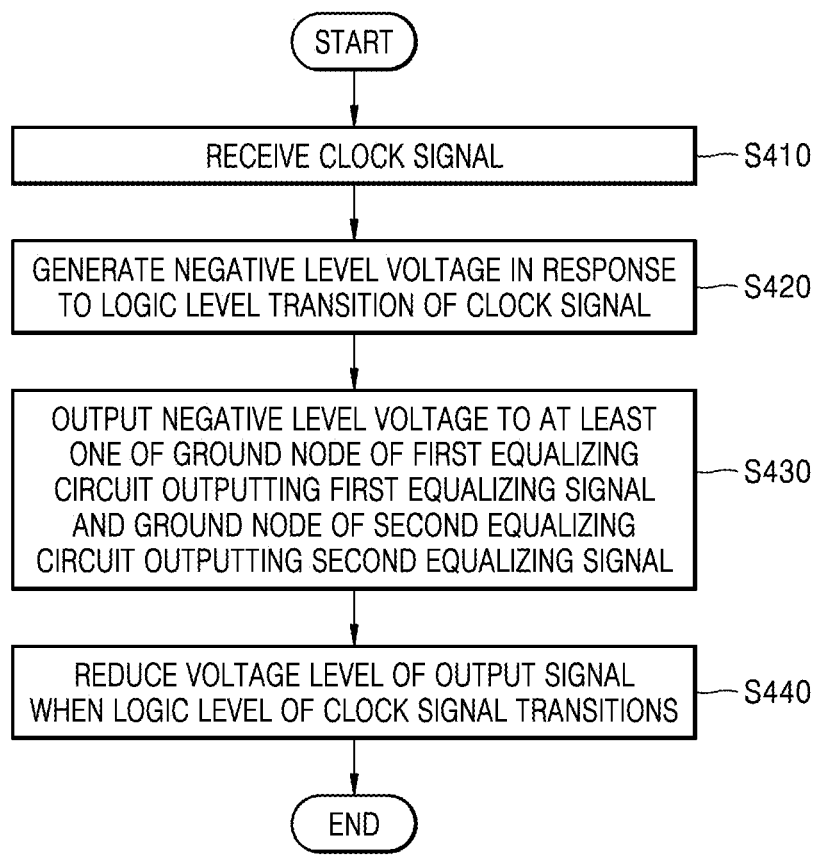
FIG. 14 is a flow chart of an operation method of an electronic device, according to an example embodiment of the inventive concepts.

FIG. 14 is a flowchart of an operation method of the electronic device 1, according to an example embodiment of the inventive concepts. Hereinafter, descriptions are given with reference numbers with reference to the above-described drawings.

Referring to FIG. 14, in operation S410, the pull-down circuit 140 may receive the clock signal CLK. In addition, the complementary clock signal CLKB obtained by inverting the clock signal CLK may be received. The driving voltage VDD or the ground voltage may be applied to the capacitor CB based on the clock signal CLK and the complementary clock signal CLKB.

In operation S420, the pull-down circuit 140 may generate a negative level voltage in response to a logic level transition of the clock signal CLK.

Thereafter, in operation S430, the pull-down circuit 140 may output the negative level voltage to at least one of the first ground node GN1 of the first equalizing circuit 131, which outputs the first equalizing signal EQ1, and the second ground node of the second equalizing circuit 132, which outputs the second equalizing signal EQ2.

In operation S440, the pull-down circuit 140 may reduce the voltage level of the output signal DO when the logic level of the clock signal CLK is transitioned.

Figure 15:
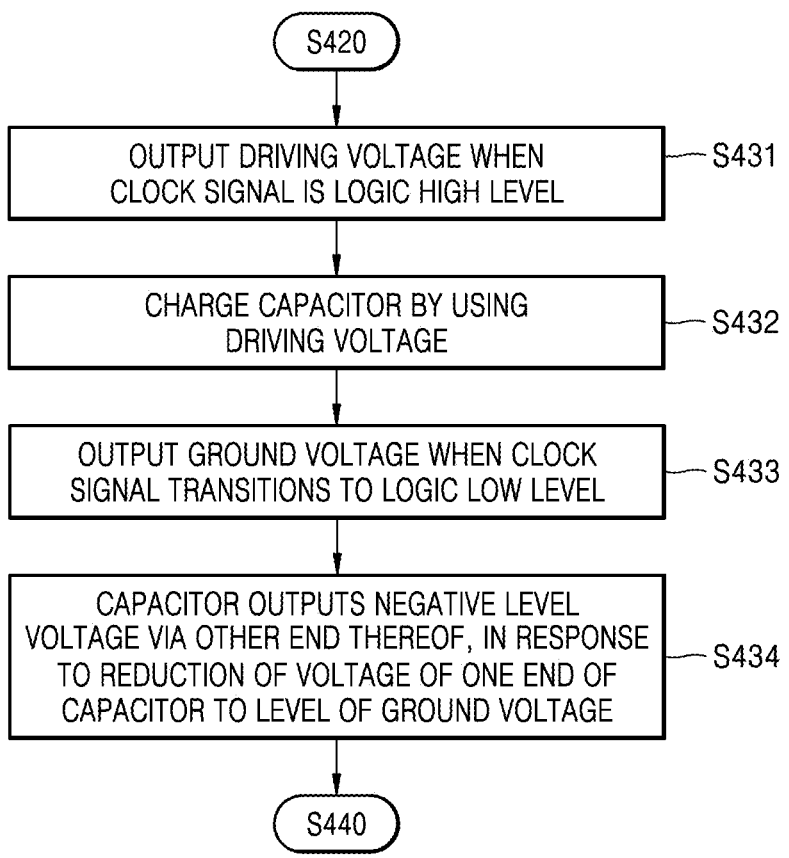
FIG. 15 is a flow chart of an operation method of an electronic device, according to an example embodiment of the inventive concepts.

FIG. 15 is a flowchart of an operation method of the electronic device 1, according to an example embodiment of the inventive concepts. Hereinafter, descriptions are given with reference numbers with reference to the above-described drawings.

Referring to FIG. 15, in operation S431, the pull-down circuit 140 according to an example embodiment of the inventive concepts may, when the clock signal CLK is at the logic high level, control the plurality of switches (SW1 through SW3) and output the driving voltage VDD to one end of the capacitor CB.

In operation S432, the pull-down circuit 140 may charge the capacitor CB by using the driving voltage VDD.

Thereafter, in operation S433, when the clock signal CLKB is transitioned to the logic low level, the pull-down circuit 140 may control the plurality of switches (SW1 through SW3) and output the ground voltage to one end of the capacitor CB.

In this case, since the voltage at one end of the capacitor CB is transitioned from the driving voltage to the ground voltage and the capacitor CB is required to preserve a charge amount, the voltage at the other end of the capacitor CB may be reduced from the ground voltage to the negative level voltage. In other words, in operation S434, the pull-down circuit 140 may, in response to reduction of the voltage VC1 at one end of the capacitor CB to the ground voltage level, output the negative level voltage via the other end of the capacitor CB.

The first chip 10 and the second chip 20 and the sub-components thereof including one or more of the elements of the equalizing circuit 100, 100a may include processing circuitry including, but is not limited to, a central processing unit (CPU), an arithmetic logic unit (ALU), a digital signal processor, a microcomputer, a field programmable gate array (FPGA), a programmable logic unit, a microprocessor, application-specific integrated circuit (ASIC), etc. The processing circuitry may be special purpose processing circuitry that configures the equalizing circuit 100 to generate the pulse signal PS and output the second equalizing signal EQ2 that includes pulse signals only in a period in which the rising edge and the falling edge of the data signal DT occur, and generate the output signal DO based on the second equalizing signal EQ2. Accordingly, the output signal DO may accurately indicate a digital data value indicated by the data signal DT, or the original data, and since the magnitude of the edge of the output signal DO is large, the special purpose processing circuitry may improve the performance of the electronic device 1 by reducing the ISI and improving the eye opening performance.

While the inventive concepts has been particularly shown and described with reference to some example embodiments thereof, it will be understood that various changes in form and details may be made therein without departing from the spirit and scope of the following claims.

What is claimed is:

1. An electronic device comprising:
   a first equalizing circuit configured to receive a data signal, and to generate a first equalizing signal based on the data signal;
   a pulse generator configured to generate a first pulse signal and a second pulse signal in response to a rising edge and a falling edge of the data signal, respectively;
   a second equalizing circuit configured to output a second equalizing signal based on an inverted first pulse signal and an inverted second pulse signal, the inverted first pulse signal and the inverted second pulse signal being inversions of the first pulse signal and the second pulse signal, respectively; and
   an output terminal configured to output an output signal based on the first equalizing signal and the second equalizing signal.

2. The electronic device of claim 1, wherein
   the first pulse signal includes a positive pulse signal,
   the second pulse signal includes a negative pulse signal, and
   pulse widths of the first pulse signal and the second pulse signal are each less than a pulse width of the data signal.

3. The electronic device of claim 1, wherein the second equalizing circuit further comprises:
   a first transistor including a gate terminal configured to receive the second pulse signal; and
   a second transistor including a gate terminal configured to receive the first pulse signal.

4. The electronic device of claim 1, wherein the output terminal is configured to electrically connect the first equalizing circuit and the second equalizing circuit with an external device via a channel.

5. The electronic device of claim 1, further comprising:
   a pull-down circuit connected to at least one of the first equalizing circuit and the second equalizing circuit, the pull-down circuit configured to reduce a voltage level of the output signal by providing a first voltage to ground nodes of the at least one of the first equalizing circuit and the second equalizing circuit.

6. The electronic device of claim 5, wherein the pull-down circuit is configured to,
   receive a clock signal, and
   reduce a voltage level of the output signal to a negative level while the clock signal maintains a logic low level.

7. The electronic device of claim 6, wherein the clock signal transitions to the logic low level in response to a transition of the first pulse signal to a logic high level.

8. The electronic device of claim 5, wherein the pull-down circuit further comprises:
   a switching circuit; and
   a capacitor including a first end and a second end, the first end connected to the switching circuit, and the second end connected to the ground node of at least one of the first equalizing circuit and the second equalizing circuit, wherein
      the switching circuit is configured to adjust a voltage applied to the capacitor.

9. The electronic device of claim 8, wherein the switching circuit further comprises:
   a plurality of switches configured to switch between outputting a driving voltage and outputting a ground voltage based on a clock signal such that,
      the switching circuit applies the driving voltage to the second end of the capacitor, when the clock signal is at a logic high level, and
      the switching circuit reduces a voltage of the ground node of the at least one of the first equalizing circuit and the second equalizing circuit to a negative level by applying the ground voltage to the second end of the capacitor, when the clock signal transitions from the logic high level to the logic low level.

10. The electronic device of claim 9, wherein the pull-down circuit is configured to determine voltages of the ground node of the at least one of the first equalizing circuit and the second equalizing circuit based on a voltage at the second end of the capacitor.

11. An electronic device comprising:
    a first equalizing circuit configured to receive a data signal, and to generate a first equalizing signal having a phase inverted from a phase of the data signal;
    a pulse generator configured to,
       generate a negative pulse signal based on a falling edge of the data signal, and
       generate a positive pulse signal based on a rising edge of the data signal;
    a second equalizing circuit configured to output a second equalizing signal based on an inverted pulse signal generated by inverting the negative pulse signal and the positive pulse signal; and
    an output terminal configured to output an output signal based on the first equalizing signal and the second equalizing signal.

12. The electronic device of claim 11, wherein the pulse generator is configured to generate the negative pulse signal and the positive pulse signal such that pulse widths of the negative pulse signal and the positive pulse signal are each less than a pulse width of the data signal.

13. The electronic device of claim 11, wherein the pulse generator is configured to generate the negative pulse signal such that the negative pulse signal transitions to a logic low level in response to generation of the falling edge of the data signal and returns to a logic high level before the rising edge of the data signal is generated.

14. The electronic device of claim 11, wherein the pulse generator is configured to generate the positive pulse signal such that the positive pulse signal transitions to a logic high level in response to generation of the rising edge of the data signal and returns to a logic low level before the falling edge of the data signal is generated.

15. The electronic device of claim 11, wherein the second equalizing circuit further comprises:
    an inverter circuit including a first transistor and a second transistor, the first transistor having a gate terminal configured to receive the negative pulse signal, and the second transistor having a gate terminal configured to receive the positive pulse signal.

16. A method of operating an electronic device, the method comprising:
    receiving, by a pulse generator included in the electronic device, a data signal;
    generating, by a first equalizing circuit included in an equalizer circuit within the electronic device, a first equalizing signal having a phase inverted from a phase of the data signal;
    generating, by the pulse generator, a negative pulse signal, based on a falling edge of the data signal;

generating, by the pulse generator, a positive pulse signal based on a rising edge of the data signal;

outputting, by a second equalizing circuit included in the equalizer circuit, a second equalizing signal based on an inverted pulse signal generated by inverting the negative pulse signal and the positive pulse signal; and outputting, by the equalizer circuit, an output signal obtained based on the first equalizing signal and the second equalizing signal.

17. The method of claim 16, further comprising:

transitioning the negative pulse signal to a logic low level in response to generation of the falling edge of the data signal; and returning the negative pulse signal to a logic high level before the rising edge of the data signal is generated.

18. The method of claim 16, further comprising:

transitioning the positive pulse signal to a logic high level in response to generation of the rising edge of the data signal; and returning the positive pulse signal to a logic low level before the falling edge of the data signal is generated.

19. The method of claim 16, wherein the method further comprises:

reducing a voltage level of the output signal when a logic level of a clock signal transitions by, receiving the clock signal;

generating a negative level voltage in response to the logic level of the clock signal transitioning; and outputting the negative level voltage to a ground node of at least one of the first equalizing circuit and the second equalizing signal.

20. The method of claim 19, wherein the outputting of the negative level voltage comprises:

outputting a driving voltage when the clock signal is at a logic high level;

charging a capacitor by the driving voltage, the capacitor having a first end and a second end;

outputting a ground voltage when the clock signal transitions to a logic low level; and outputting, by the capacitor, the negative level voltage via the second end of the capacitor, in response to a voltage at the first end of the capacitor being reduced to a level of the ground voltage.

* * * * *